(12) United States Patent
Bamba et al.

(10) Patent No.: US 11,287,860 B2
(45) Date of Patent: Mar. 29, 2022

(54) AMBIENT TEMPERATURE ESTIMATING DEVICE, AMBIENT TEMPERATURE ESTIMATING METHOD, PROGRAM AND SYSTEM

(71) Applicant: EIZO Corporation, Hakusan (JP)

(72) Inventors: Yusuke Bamba, Hakusan (JP); Mamoru Ogaki, Hakusan (JP); Koichi Tanoiri, Hakusan (JP); Keita Hashi, Hakusan (JP); Takuya Matsuda, Hakusan (JP)

(73) Assignee: EIZO CORPORATION, Hakusan (JP)

( * ) Notice: Subject to any disclaimer, the term of this patent is extended or adjusted under 35 U.S.C. 154(b) by 209 days.

(21) Appl. No.: 16/649,351

(22) PCT Filed: Sep. 7, 2018

(86) PCT No.: PCT/JP2018/033233
§ 371 (c)(1),
(2) Date: Mar. 20, 2020

(87) PCT Pub. No.: WO2019/059000
PCT Pub. Date: Mar. 28, 2019

(65) Prior Publication Data
US 2020/0301487 A1    Sep. 24, 2020

(30) Foreign Application Priority Data
Sep. 25, 2017 (JP) .............................. JP2017-183582

(51) Int. Cl.
*G06F 1/20* (2006.01)
*G05D 23/19* (2006.01)
*H05K 7/20* (2006.01)

(52) U.S. Cl.
CPC .......... *G06F 1/206* (2013.01); *G05D 23/1917* (2013.01); *H05K 7/20954* (2013.01)

(58) Field of Classification Search
CPC .......... G01K 13/00; G01K 7/427; G01K 1/20; G01K 7/00; G01K 7/42; G09G 2320/041;
(Continued)

(56) References Cited

U.S. PATENT DOCUMENTS

| 6,995,355 B2 * | 2/2006 | Rains, Jr. ............ G09F 13/0404 |
| | | 250/228 |
| 9,286,838 B2 * | 3/2016 | Yoshida ................. G01K 7/427 |

(Continued)

FOREIGN PATENT DOCUMENTS

| JP | 2002-048878 A | 2/2002 |
| JP | 2011-253006 A | 12/2011 |
| JP | 2015-534038 A | 11/2015 |

OTHER PUBLICATIONS

International Search Report dated Dec. 4, 2018 in corresponding International Application No. PCT/JP2018/033233; 4 pages.

*Primary Examiner* — Chun Cao
(74) *Attorney, Agent, or Firm* — Maier & Maier, PLLC

(57) ABSTRACT

Provided is an ambient temperature estimating device, ambient temperature estimating method, program, and system that are able to realize both high robustness and high ambient temperature estimation accuracy. An ambient temperature estimating device includes a neural network, a temperature acquisition unit configured to acquire one or more temperature values inside the ambient temperature estimating device, and a neural network calculator configured to estimate an ambient temperature around the ambient temperature estimating device using the neural network. Input values inputted to the neural network by the neural network calculator include the temperature values acquired by the temperature acquisition unit and a heat source control value for controlling a heat source inside the ambient temperature estimating device.

8 Claims, 13 Drawing Sheets

FIRST EMBODIMENT

(58) Field of Classification Search
CPC ...... G09G 3/36; G05D 23/1917; G06F 1/206;
G06N 20/20; G06N 3/08; H05K 7/20954
USPC ........................................................ 700/300
See application file for complete search history.

(56) References Cited

U.S. PATENT DOCUMENTS

| | | | |
|---|---|---|---|
| 2005/0179854 A1* | 8/2005 | Sekine | H04N 9/3144 349/161 |
| 2006/0165149 A1 | 7/2006 | Kolk | |
| 2011/0267383 A1* | 11/2011 | Murakami | G09G 3/3611 345/690 |
| 2013/0162917 A1* | 6/2013 | Sagawa | H04N 9/3155 349/5 |
| 2014/0355649 A1 | 12/2014 | Niederberger et al. | |
| 2015/0192477 A1 | 7/2015 | Sacchetti et al. | |
| 2015/0349570 A1 | 12/2015 | Niederberger et al. | |
| 2019/0238139 A1* | 8/2019 | Haneda | H03B 5/32 |

\* cited by examiner

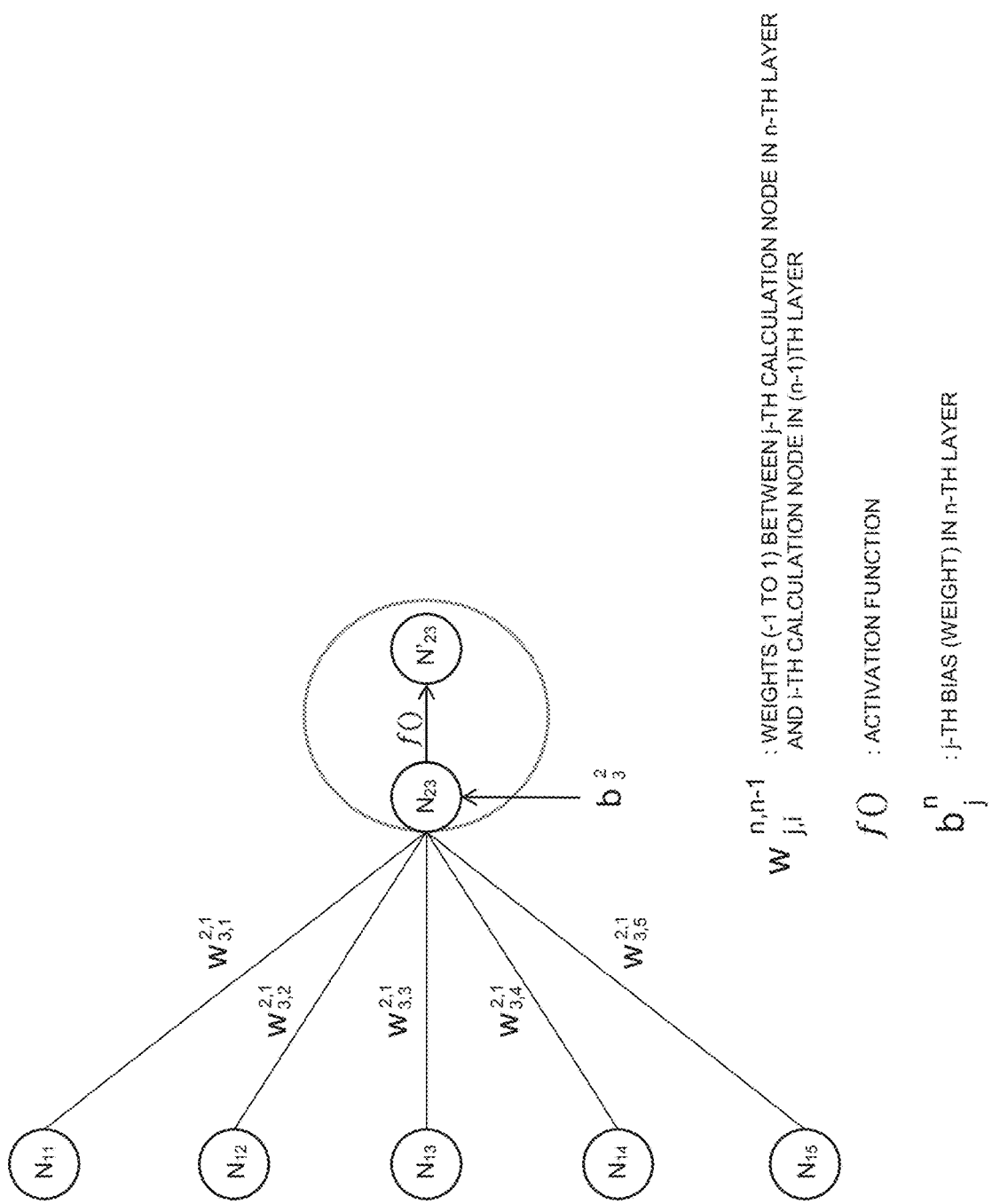

| PARAMETER | INPUT SIGNAL |
|---|---|
| 0 | 0 |
| 1 | 0.01 |
| 2 | 0.02 |
| . | . |
| . | . |
| . | . |
| 99 | 0.99 |
| 100 | 1 |

FIG.4A

| OUTPUT SIGNAL | ESTIMATED ATMOSPHERIC TEMPERATURE |
|---|---|
| 0 | 0 |
| 0.01 | 1 |
| 0.02 | 2 |
| . | . |
| . | . |
| . | . |
| 0.99 | 99 |
| 1 | 100 |

FIG.4B

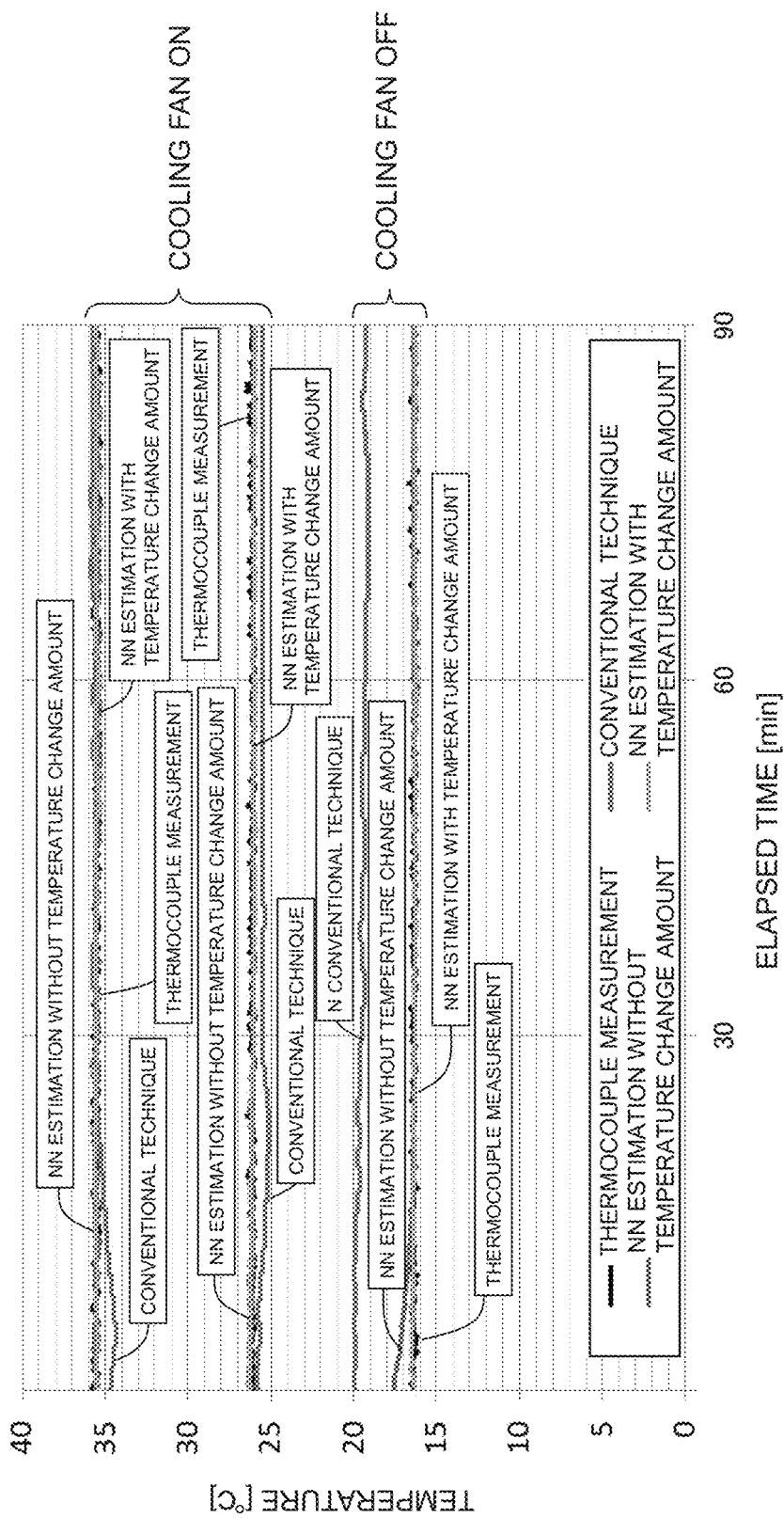

AMBIENT TEMPERATURE ESTIMATING DEVICE, AMBIENT TEMPERATURE ESTIMATING METHOD, PROGRAM AND SYSTEM

TECHNICAL FIELD

The present invention relates to an ambient temperature estimating device, ambient temperature estimating method, program, and system.

BACKGROUND ART

There have been proposed technologies for estimating the ambient temperature around a display device to favorably maintain gradation characteristics of the display device.

Patent Literature 1 discloses a display device that is able to estimate the ambient temperature by using two or more temperature sensors disposed in the display device and the correlation between temperatures detected by the temperature sensors.

CITATION LIST

Patent Literature

Patent Literature 1: Japanese Unexamined Patent Application Publication No. 2013-108801

SUMMARY OF INVENTION

Technical Problem

Patent Literature 1 requires enormous man-hours to position the temperature sensors or adjust parameters used to estimate the ambient temperature. Specifically, in the case of Patent Literature 1, the operator needs to manually adjust the parameters in order to increase the estimation accuracy, resulting in an increase in man-hours. If the operator fails to increase the estimation accuracy, he or she needs to rework, that is, needs to reposition the temperature sensors.

Patent Literature 1 determines the correlation between the temperatures on the assumption that the cooling fan of the display device is being driven under a constant control value. The reason is that if the control value of the cooling fan is dynamically changed, the temperatures detected by the two or more temperature sensors are also dynamically changed, which makes it extremely difficult to mathematically express the correlation between the temperatures on the basis of FIG. 4 of Patent Literature 1. Accordingly, dynamical changes in the control value of the cooling fan in the display device would reduce the estimation accuracy of the technology of Patent Literature 1.

The present invention has been made in view of the foregoing, and an object thereof is to provide an ambient temperature estimating device, ambient temperature estimating method, and program that are able to estimate the ambient temperature with less man-hours and with high accuracy, without largely depending on the positions of the temperature sensors.

Another object of the present invention is to provide an ambient temperature estimating device, ambient temperature estimating method, and program that estimate the ambient temperature with high accuracy even if the control value of the cooling fan is dynamically changed.

Solution to Problem

The present invention provides an ambient temperature estimating device includes a neural network, a temperature acquisition unit configured to acquire one or more temperature values inside the ambient temperature estimating device, and a neural network calculator configured to estimate an ambient temperature around the ambient temperature estimating device using the neural network. Input values inputted to the neural network by the neural network calculator include the temperature values acquired by the temperature acquisition unit and a heat source control value for controlling a heat source inside the ambient temperature estimating device.

According to the present invention, the ambient temperature is estimated by inputting, to the neural network, parameters including the one or more temperature values inside the ambient temperature estimating device and the heat source control value for controlling the heat source inside the ambient temperature estimating device. Thus, the ambient temperature estimation accuracy becomes extremely high.

Various embodiments of the present invention are described below. The embodiments below can be combined with each other.

Preferably, the ambient temperature estimating device further includes a cooling controller configured to control an inside of the ambient temperature estimating device based on a cooling control value, and the input values include the cooling control value.

Preferably, the cooling controller is configured to dynamically control the cooling control value.

Preferably, the input values include the amount of change in the temperature values in a predetermined period.

Preferably, the heat source is a backlight or an internal circuit.

Preferably, the input values include an energizing time of at least one of the ambient temperature estimating device and the heat source.

Preferably, the neural network includes multiple calculation nodes, predetermined weights are set for the respective calculation nodes, and the weights are set through machine learning previously performed by another information processing device or through machine learning performed by the ambient temperature estimating device.

Another aspect provides an ambient temperature estimating method including a temperature acquisition step of acquiring, by a temperature acquisition unit, one or more temperature values inside an ambient temperature estimating device and a neural network calculation step of estimating, by a neural network calculator, an ambient temperature around the ambient temperature estimating device using a neural network. Input values inputted to the neural network include the temperature values acquired by the temperature acquisition unit and a heat source control value for controlling a heat source inside the ambient temperature estimating device.

Yet another aspect provides a program for causing a computer to function as a neural network, a temperature acquisition unit configured to acquire one or more temperature values inside an ambient temperature estimating device, and a neural network calculator configured to estimate an ambient temperature around the ambient temperature estimating device using the neural network. Input values inputted to the neural network by the neural network calculator include the temperature values acquired by the temperature acquisition unit and a heat source control value for controlling a heat source inside the ambient temperature estimating device.

Still yet another aspect provides a system including one of the above ambient temperature estimating devices and an information processing device. The ambient temperature estimating device and the information processing device include communication units configured to be able to communicate data to each other and neural networks. The neural networks each include multiple calculation nodes. Predetermined weights are set for the respective calculation nodes. The information processing device is configured to acquire, through the communication unit, temperature values acquired by the temperature acquisition unit of the ambient temperature estimating device and a heat source control value for controlling a heat source inside the ambient temperature estimating device. The calculation nodes and the weights are determined by machine leaning of the temperature values and the heat source control value using the neural network of the information processing device, the temperature values from the ambient temperature estimating device and the heat source control value both being acquired by the communication unit of the information processing device. The ambient temperature estimating device is configured to acquire the determined weights through the communication unit.

BRIEF DESCRIPTION OF THE DRAWINGS

FIG. 3 is a diagram showing weights w used in the neural network calculation.

FIG. 4A shows an example of a table showing the relationships between parameters inputted to the neural network 20 and input signals, and FIG. 4B an example of a table showing the relationships between output signals outputted from the neural network 20 and ambient temperatures.

FIG. 11 is a graph showing two ambient temperatures estimated by the ambient temperature estimating device 1 of one of the embodiments of the present invention and an ambient temperature estimated using two temperature sensors without applying the present invention.

DESCRIPTION OF EMBODIMENTS

Now, embodiments of the present invention will be described with reference to the drawings. Various features described in the embodiments below can be combined with each other.

1. First Embodiment

Referring now to FIGS. 1 to 7, an ambient temperature estimating device 1 according to a first embodiment of the present invention will be described. For example, the ambient temperature estimating device 1 of the first embodiment can be applied to display devices. Hereafter, an example in which the ambient temperature estimating device 1 is applied to a display device will be described.

Ambient Temperature Estimating Device 1

Figure 1:
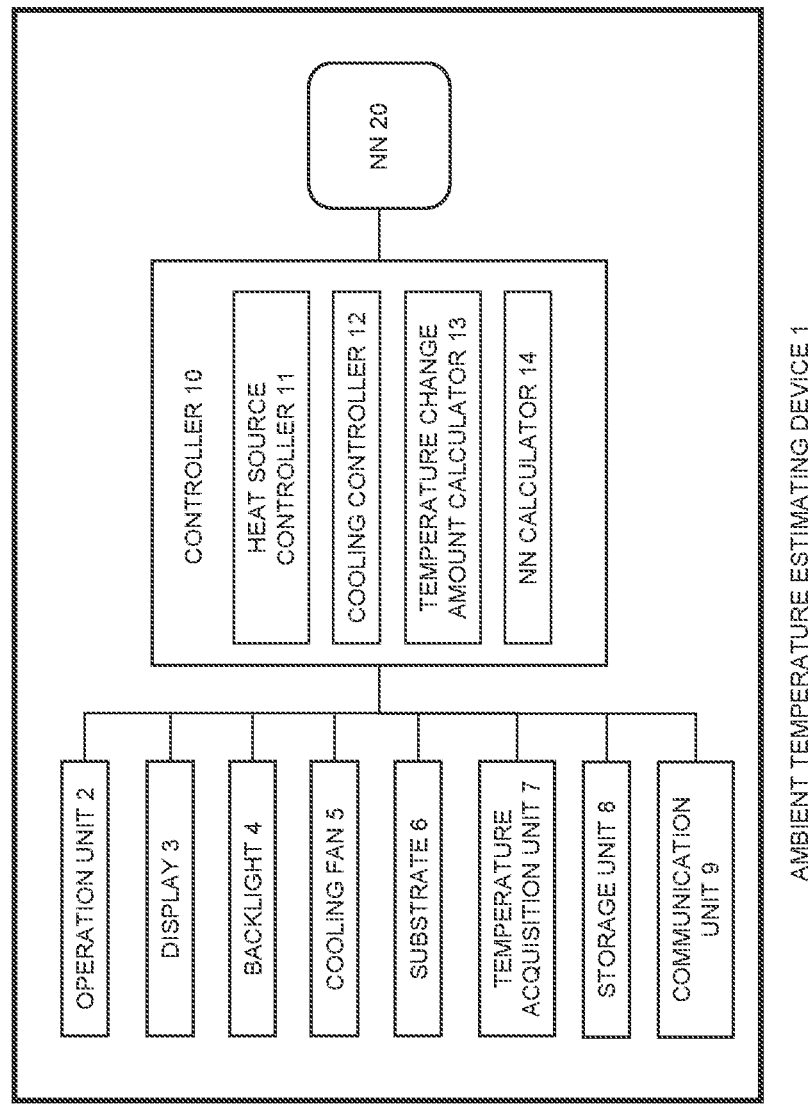
FIG. 1 is a block diagram of an ambient temperature estimating device 1 of a first embodiment of the present invention.

As shown in FIG. 1, the ambient temperature estimating device 1 includes an operation unit 2, a display 3, a backlight 4, a cooling fan 5, a substrate 6, a temperature acquisition unit 7, a storage unit 8, a communication unit 9, a controller 10, and a neural network 20 (denoted by NN in the drawings; the same applies hereafter).

The operation unit 2 is, for example, a touchscreen, a keyboard, switches, a voice input unit, or a motion detector and is used to operate the display 3. For example, the operator handles various types of setting information on screen display (OSD) using the operation unit 2. The display 3 is, for example, a liquid crystal display, an organic EL display, a touchscreen display, or any other type of display and displays various types of images (including still and moving images). The backlight 4 illuminates the display 3 and can be a heat source that emits heat into the ambient temperature estimating device 1. The backlight 4 is configured such that the light intensity thereof can be controlled by a heat source control value (to be discussed later). The cooling fan 5 is disposed inside the ambient temperature estimating device 1 and is used to cool the inside of the ambient temperature estimating device 1. The cooling fan 5 is configured such that the drive strength thereof can be controlled by a cooling control value (to be discussed later). The substrate 6 has thereon internal circuits disposed inside the ambient temperature estimating device 1. As with the backlight 4, the internal circuits disposed on the substrate 6 are an example of a heat source. In other words, the heat source in the present embodiment is the backlight 4 or internal circuits.

If the ambient temperature estimating device 1 is applied to a display device including an organic EL display, the backlight 4 is not an essential element, since the organic EL display emits light spontaneously.

The temperature acquisition unit 7 is, for example, a temperature sensor and acquires one or multiple temperature values inside the ambient temperature estimating device 1. The temperature values may be actual temperatures, or may be values that have undergone predetermined processing or values having proportional relations or correlations with the actual temperatures. For example, the temperature value may be 0 when the temperature is 0° C. and may be 1 when the temperature is 100° C. The temperature acquisition unit 7 may be disposed in any position inside the ambient temperature estimating device 1. The storage unit 8 is, for example, a memory, HDD, or SSD and stores various types of data or programs. The communication unit 9 is any type of I/O and transmits and receives various types of data to and from the controller 10 or another information processing device.

The controller 10 includes a heat source controller 11, a cooling controller 12, a temperature change amount calculator 13, and a neural network calculator 14 (denoted by the NN calculator in the drawings; the same applies hereafter). The heat source controller 11 controls the heat source inside the ambient temperature estimating device 1 on the basis of the heat source control value. In the present embodiment, the backlight 4 is handled as a heat source, and the heat source control value is the luminance set value of the backlight 4. The heat source control value (luminance set value) may be any value and may be, for example, 0 (a set value at which the luminance of the backlight 4 is minimized (0)) to 100 (a set value at which the luminance of the backlight 4 is maximized). The cooling controller 12 controls the inside of the ambient temperature estimating device 1 on the basis of the cooling control value. In the present embodiment, the cooling control value is the control value of the cooling fan 5. The cooling control value may be any value and may be, for example, 0 (a set value at which the drive of the cooling fan 5 is minimized (the cooling fan 5 stops)) to 100 (a set value at which the drive of the cooling fan 5 is maximized). The cooling controller 12 is configured to dynamically control the cooling control value. Thus, it is able to dynamically change the drive strength of the cooling fan 5. Accordingly, the cooling controller 12 increases the drive strength of the cooling fan 5 when the temperature inside the ambient temperature estimating device 1 is high; it reduces the drive strength of the cooling fan 5 when the temperature inside the ambient temperature estimating device 1 is low, allowing for a reduction in power consumption.

The temperature change amount calculator 13 calculates the amount of change in temperature value in a predetermined period on the basis of temperature values acquired by the temperature acquisition unit 7. The predetermined period may be any period of time and may be, for example, 1 sec, 10 sec, 30 sec, 1 min, 3 min, 5 min, 10 min, or a period longer or shorter than these periods. The neural network calculator 14 estimates the ambient temperature around the ambient temperature estimating device 1 using the neural network 20 (to be discussed later). In the present embodiment, the neural network calculator 14 inputs input values based on parameters to the neural network 20. The input values inputted to the neural network 20 by the neural network calculator 14 include the temperature values acquired by the temperature acquisition unit 7 and the heat source control value for controlling the heat source inside the ambient temperature estimating device 1. As used herein, the terms "ambient temperature" refers to a temperature that is not influenced by a temperature increase caused by the heating of the ambient temperature estimating device 1, or the like. Accordingly, when the ambient temperature estimating device 1 is indoors, the ambient temperature is approximately equal to indoor temperature; when the ambient temperature estimating device 1 is outdoors, it is approximately equal to outdoor temperature. Specifically, the neural network calculator 14 inputs the temperature values acquired by the temperature acquisition unit 7 and the heat source control value for controlling the heat source inside the ambient temperature estimating device 1 to the neural network 20 and outputs the ambient temperature around the ambient temperature estimating device 1. Details of the neural network calculator 14 will be described later with reference to FIGS. 3 and 4.

The neural network 20 includes multiple calculation nodes N and receives input values based on parameters. Predetermined weights w are set for the respective calculation nodes N. A weight w denotes the connection efficiency of a calculation node N and is also called a connection weight. The neural network 20 can be implemented as software or hardware. For example, it can be implemented on the firmware of the ambient temperature estimating device 1. In the present embodiment, the weights w are set through machine learning previously performed by another information processing device 30 (to be discussed later) or through machine learning performed inside the ambient temperature estimating device. Details will be described later.

Figure 2:
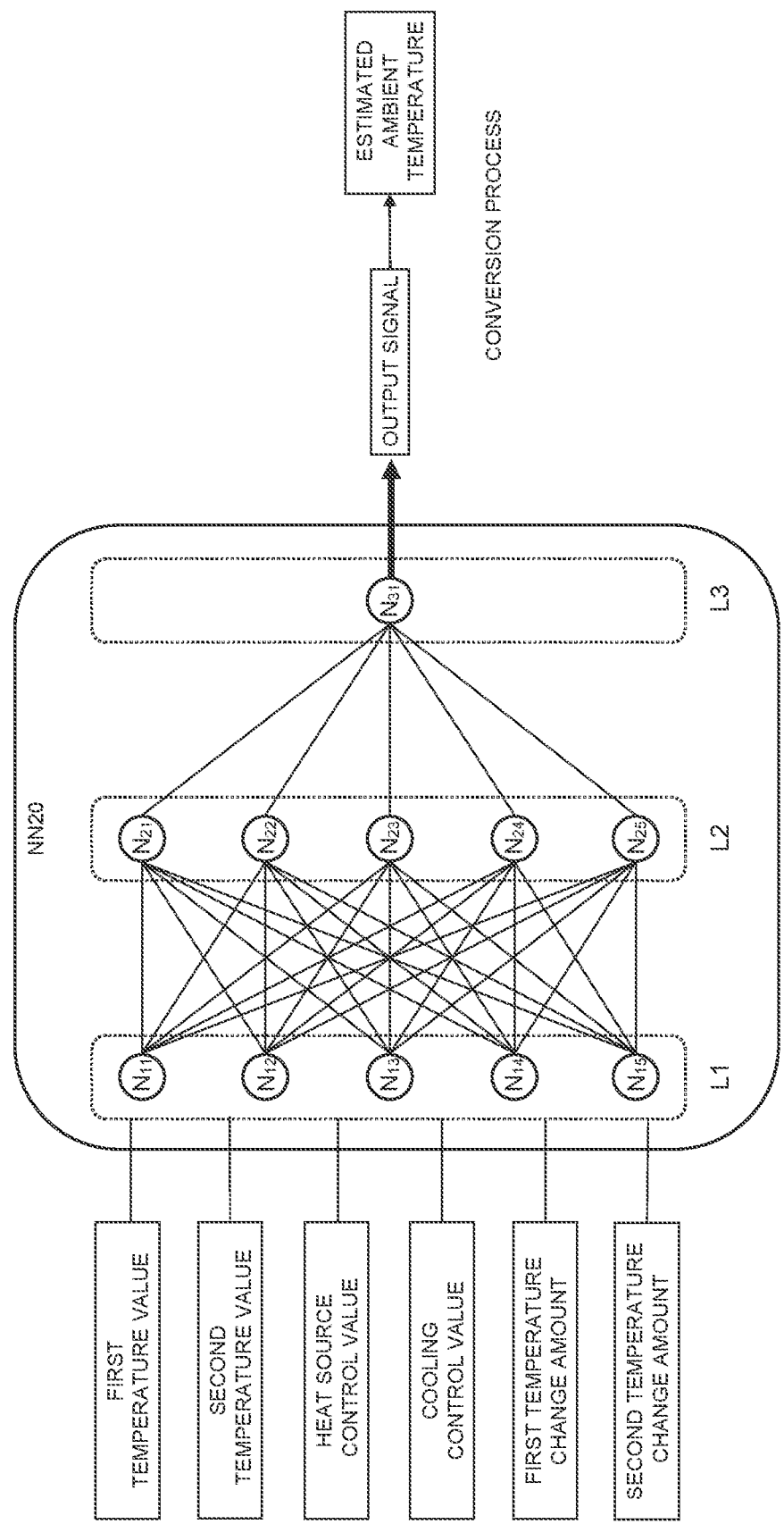
FIG. 2 is a concept diagram showing the configuration of a neural network 20 and neural network calculation performed by a neural network calculator 14.

As shown in FIG. 2, the neural network 20 includes multiple layers (first to third layers L1 to L3) and multiple calculation nodes N (N11 to N31). Here, Nij denotes the j-th calculation node N in the i-th layer. In the present embodiment, the neural network 20 is constructed assuming that i=3 and j=5. Note that i and j need not be these values and may be, for example, integers of 1 to 100 or integers greater than 100.

The predetermined weights w are set for the respective calculation nodes N. As shown in FIG. 3, for example, attention is paid to the calculation node N23 in the second layer. In this case, weights w are set between the calculation node N23 and all the calculation nodes N11 to N15 in the first layer, which is the preceding layer. For example, the weights w are values of −1 to 1.

The neural network calculator 14 inputs parameters to the neural network 20. In the present embodiment, the parameters inputted to the neural network 20 are a first temperature value, a second temperature value, the heat source control value, the cooling control value, a first temperature change amount, and a second temperature change amount. As used herein, the terms "first temperature value and second temperature value" refer to temperature values based on a first temperature and a second temperature detected by two temperature sensors provided as the temperature acquisition unit 7. The terms "first temperature change amount and second temperature change amount" refer to the amount of change in the first temperature value and the amount of change in the second temperature value in a predetermined period.

As seen above, in the present embodiment, the input values inputted to the neural network 20 include the temperature values and heat source control value, as well as the cooling control value and the amounts of change in the temperature values in the predetermined period.

As shown in FIG. 4, the parameters are normalized to values of 0 to 1 before being inputted to the neural network 20. For simplification, in the present embodiment, it is assumed that all the parameters are 0 to 100 and are converted into input values of 0 to 1. For example, when the first temperature is 0° C., it is inputted as an input signal of 0 (=first temperature value). When the first temperature is 100° C., it is inputted as an input signal of 1 (=first temperature value). For the heat source control value, when the luminance set value is 0, it is inputted as an input signal of 0 (=heat source control value). When the luminance set value is 100, it is inputted as an input signal of 1 (=heat source control value). The other parameters of 0 to 100 are also converted into input signals of 0 to 1.

As shown in FIG. 2, the neural network calculator 14 inputs the input signals converted from the parameters to the first layer L1. The signals are each output from the calculation nodes N11 to N15 in the first layer to the calculation nodes N21 to N25 in the second layer L2. At this time, the calculation nodes N11 to N15 each output, to the calculation nodes N21 to N25, values obtained by multiplying the input values by the weights w set for the respective calculation nodes N. The calculation nodes N21 to N25 each add up the input values, add a bias b shown in FIG. 3 to the input value added up (a resulting value), and input the resulting value to an activation function f( ). Then, the output values of the activation function f( ) (output values from a virtual calculation node N'23 in an example in FIG. 3) are propagated to the calculation node N31, which is the subsequent node. At this time, values obtained by multiplying the output values by the weights set between the calculation nodes N21 to N25 and the calculation node N31 are inputted to the calculation node N31. The calculation node N31 adds up the input values and outputs the resulting value as an output value. At this time, the calculation node N31 may add up the input values, add a bias to the value added up, input the resulting value into to an activation function, and output the output value thereof as an output signal. In the present embodiment, the value of the output signal is adjusted so as to become a value of 0 to 1. Then, as shown in FIG. 4B, the neural network calculator 14 outputs a value corresponding to the value of the output signal as an estimated ambient temperature.

The controller 10 adjusts the luminance, chromaticity, or unevenness of the display 3 on the basis of the estimated ambient temperature. For example, to correct gradation characteristics of the display 3, the controller 10 adjusts the luminance of the display 3 by rewriting a LUT table (not shown) (gamma correction) on the basis of the estimated ambient temperature.

As seen above, in the present embodiment, the ambient temperature estimating device 1 is able to estimate the ambient temperature with higher accuracy than conventional accuracy by inputting the parameters to the neural network 20 as input values and using the weights w set through machine learning previously performed by another information processing device 30 or through machine learning performed by the ambient temperature estimating device 1.

While, in the present embodiment, the amount of change in temperature value in the predetermined period is used as an input value inputted to the neural network 20, the energizing time of at least one of the ambient temperature estimating device 1 and the heat source may be used as an input value inputted to the neural network 20 in place of the amount of change in temperature value. For example, the energizing time of the ambient temperature estimating device 1 with the backlight not being energized may be used as an input value.

Information Processing Device 30

Figure 5:
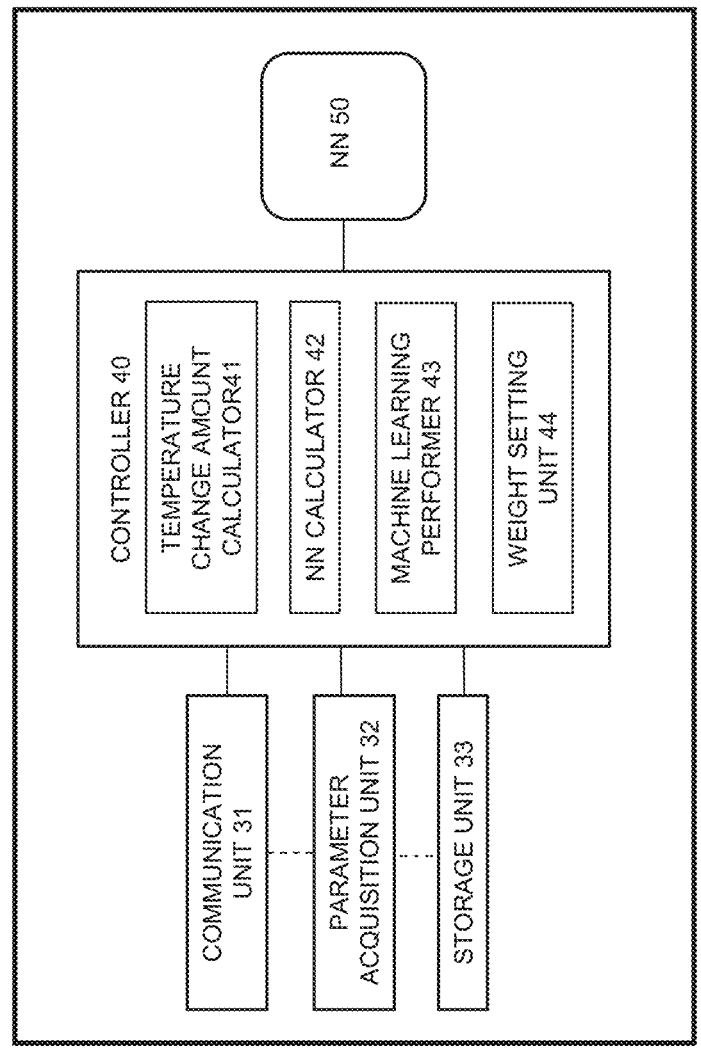
FIG. 5 is a function block diagram showing an information processing device 30 for determining weights w used by the ambient temperature estimating device 1 in neural network calculation.

Referring next to FIG. 5, the information processing device 30 that sets the weights w of the ambient temperature estimating device 1 will be described.

As shown in FIG. 5, the information processing device 30 includes a communication unit 31, a parameter acquisition unit 32, a storage unit 33, a controller 40, and a neural network 50. For example, the information processing device 30 is a computer, server, or the like. The communication unit 31, storage unit 33, and neural network 50 have functions similar to those of the communication unit 9, storage unit 8, and neural network 20 of the ambient temperature estimating device 1 and therefore will not be described. In the present embodiment, the communication unit 9 and communication unit 31 are configured to be able to transmit and receive data to and from each other. The number of layers and the configuration of the calculation nodes N in the neural network 50 may be appropriately designed by the developer as necessary.

The parameter acquisition unit 32 acquires the parameters inputted to the neural network 20 of the ambient temperature estimating device 1. The information processing device 30 acquires the parameters from the communication unit 9 of the ambient temperature estimating device 1 through the communication unit 31. The communication unit 9 and communication unit 31 may be connected to each other in any form, including wired or wireless one.

The controller 40 includes a temperature change amount calculator 41, a neural network calculator 42, a machine learning performer 43, and a weight setting unit 44. The temperature change amount calculator 41 and neural network calculator 42 have functions similar to those of the temperature change amount calculator 13 and neural network calculator 14 of the ambient temperature estimating device 1 and therefore will not be described.

The machine learning performer 43 performs machine learning for estimating the ambient temperature by inputting the parameters acquired by the parameter acquisition unit 32 into the neural network 50 and repeating calculation using the neural network calculator 42. The machine learning performer 43 then determines the weights w on the basis of the results of the machine learning.

The weight setting unit 44 sets, for the neural network 50, the determined weights w, which are to be set for the ambient temperature estimating device 1, as a result of the machine learning performed by the machine learning performer 43.

Hereafter, machine learning performed by the information processing device 30 will be described.

Figure 6:
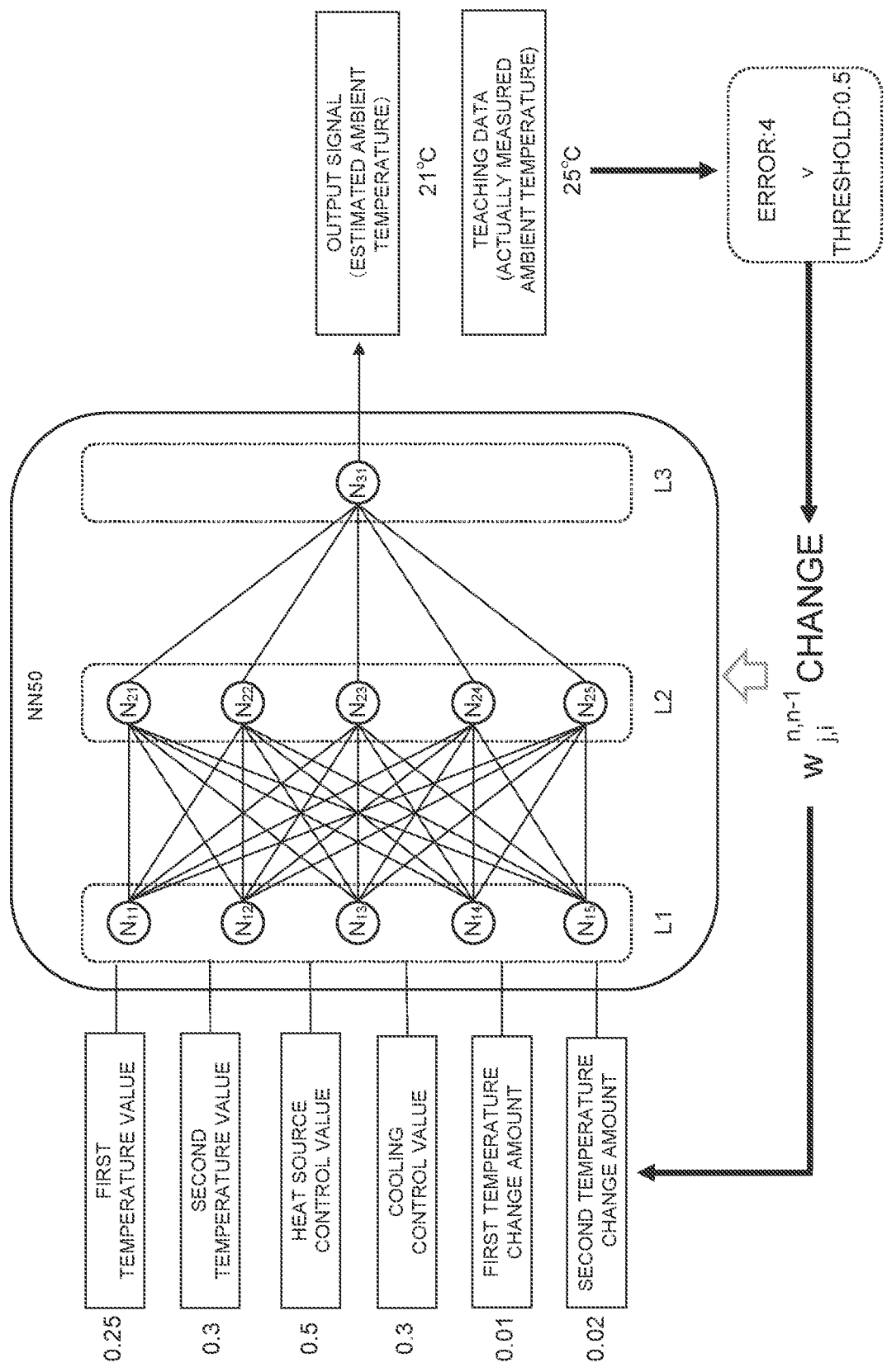
FIG. 6 is a concept diagram showing the aspect of machine learning performed by the information processing device 30 using a neural network 50.

As shown in FIG. 6, the machine learning performer 43 sets weights w of, e.g., −1 to 1 for the calculation nodes N constituting the neural network 50 having the same configuration as the neural network 20 shown in FIG. 2. To reduce the influence of the weights w, it is preferred to initially set weights w having small absolute values. The machine learning performer 43 then inputs a set of six input values acquired by the information processing device 30 to the neural network 50. The machine learning performer 43 then makes a comparison between an output signal from the neural network 50 and teaching data indicating an actually measured ambient temperature value. When the difference between the output signal and the teaching data (hereafter referred to as the "error") is equal to or greater than a predetermined threshold, the machine learning performer 43 changes the weights w and re-inputs the set of six input values to the neural network 50. At this time, the weights w are changed using known backpropagation or the like. By repeatedly performing such calculation (machine learning), the error between the output signal from the neural network 50 and the teaching data is minimized. The frequency of machine learning is not limited to a particular frequency and may be, for example, 1,000 to 20,000 times. Even if the error between the output signal and the previously given teaching data is not actually minimized, the machine learning may be completed when the error becomes equal to or smaller than the predetermined threshold, or may be completed by the developer at any timing.

After the machine learning performer 43 completes the machine learning, the weight setting unit 44 sets the then weights of the calculation nodes N for the neural network 50. Specifically, in the present embodiment, the weights w are stored in a storage unit, such as a memory, provided on the neural network 50. The weights w set by the weight setting unit 44 are transmitted to the ambient temperature estimating device 1 through the communication unit 31 and used as the weights of the calculation nodes N of the neural network 20 of the ambient temperature estimating device 1. In the present embodiment, the weights w are stored in a storage unit, such as a memory, provided on the neural network 20. By configuring the neural network 20 of the ambient temperature estimating device 1 as the neural network 50 of the information processing device 30 is configured, the weights w set by the weight setting unit 44 can be directly used.

Process Performed Between Information Processing Device 30 and Ambient Temperature Estimating Device 1

Figure 7:
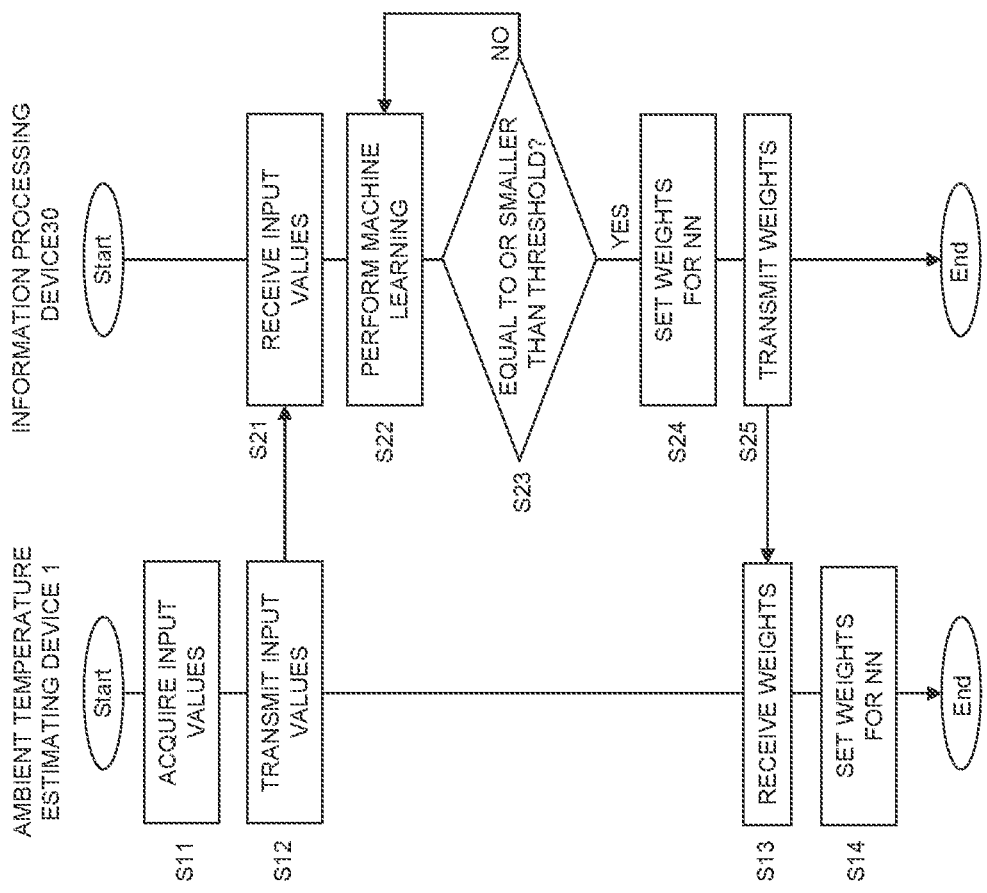
FIG. 7 is a flowchart showing a flow that ends with setting of the weights w for the ambient temperature estimating device 1.

Referring next to FIG. 7, a process performed between the information processing device 30 and ambient temperature estimating device 1 will be described.

As shown in FIG. 7, in the present embodiment, for example, the developer sets the weights w using the information processing device 30, implements the weights w on the ambient temperature estimating device 1, and then the ambient temperature estimating device 1 is sold in the market. Hereafter, a process that ends with setting of the weights w for the ambient temperature estimating device 1 will be described.

First, in S11, the ambient temperature estimating device 1 acquires the six input values shown in FIGS. 2 and 6 from the temperature acquisition unit 7 and the like. For example, when the ambient temperature around the ambient temperature estimating device 1 is 25° C., it is assumed that the six input values are as follows.

First temperature value: 0.25
Second temperature value: 0.3
Heat source control value: 0.5
Cooling control value: 0.3
First temperature change amount: 0.01
Second temperature change amount: 0.02

The ambient temperature estimating device 1 stores the input values in the storage unit 8 as one set.

Then, the ambient temperature estimating device 1 stores, in the storage unit 8, a set of six input values obtained by changing the ambient temperature around the ambient temperature estimating device 1. Similarly, the ambient temperature estimation apparatus 1 stores, in the storage unit 8, a set of six input values obtained by changing the heat source control value and a set of six input values obtained by changing the cooling control value. The ambient temperature estimating device 1 also acquires the temperature change amount in the predetermined period.

Then, in S12, the ambient temperature estimating device 1 is connected to the information processing device 30 and transmits the multiple input value sets to the information processing device 30. The ambient temperature estimating device 1 may be connected to the information processing device 30 in or before S11. In this case, in S11, the ambient temperature estimating device 1 may directly transmit the sets of six input values to the information processing device 30 without storing them in the storage unit 8.

In S21, the information processing device 30 receives the input value sets acquired by the ambient temperature estimating device 1.

In S22, the neural network calculator 42, machine learning performer 43, and neural network 50 work together to perform the above machine learning. Specifically, as shown in FIG. 6, a set of six input values are inputted to the first layer L1, the calculation nodes perform weighting operation, and the neural network 50 outputs an output signal.

Then, in S23, the machine learning performer 43 checks the error (temperature error) between the output signal of the neural network 50 and the previously given teaching data and determines whether the temperature error has become equal to or smaller than the predetermined threshold. For example, as shown in FIG. 6, it is assumed that the actual ambient temperature (actually measured ambient temperature), which is the teaching data, is 25° C. and the threshold is 0.5. If the estimated ambient temperature estimated on the basis of the output signal from the neural network 50 is 21° C., the temperature error between the teaching data and output signal is 4 (=25−21). Since the temperature error is greater than the predetermined threshold of 0.5, the machine learning performer 43 changes the weights w. The weights w are changed using backpropagation or the like. The neural network 50 then continues calculation using the changed weights w with the initially inputted six input value set fixed.

When the temperature error between the teaching data and output signal does not become equal to or smaller than the threshold in S23, the machine learning performer 43 continues the machine learning. On the other hand, when the temperature error becomes equal to or smaller than the threshold in S23, it completes the machine learning. The machine learning performer 43 then performs the above process with respect to all the input value sets (the input value sets with respect to multiple temperatures) and determines the weights w.

Then, in S24, the weight setting unit 44 sets the weights w determined in the above machine learning for the neural network 50. Note that the process in S24 is not essential.

Then, in S25, the information processing device 30 transmits the weights w to the ambient temperature estimating device 1.

In S13, the ambient temperature estimating device 1 receives the weights w transmitted from the information processing device 30.

Then, in S14, the ambient temperature estimating device 1 sets the weights w for the neural network 20 having the same configuration as the neural network 50 of the information processing device 30. The neural network 20 may be previously implemented on firmware.

As seen above, the results (weights w) of the machine learning performed by the information processing device 30 are set for the neural network 20 of the ambient temperature estimating device 1. Thus, the ambient temperature estimating device 1 is able to estimate the ambient temperature around the ambient temperature estimating device 1 with much higher accuracy than conventional accuracy.

The system that performs the process shown in FIG. 7 can be grasped as follows.

That is, the system includes:
the ambient temperature estimating device 1; and
the information processing device 30,
the ambient temperature estimating device 1 and information processing device 30 include the communication unit 9 and communication unit 31 capable of communicating data to each other and neural network 20 and neural network 50, respectively,
the neural network 20 and neural network 50 each include multiple calculation nodes N,
the predetermined weights w are set for the respective calculation nodes N,
the information processing device 30 is configured to acquire, through the communication unit 31, the temperature values acquired by the temperature acquisition unit 7 of the ambient temperature estimating device 1 and the heat source control value for controlling the heat source inside the ambient temperature estimating device 1, the calculation nodes N and the weights w are determined by machine-learning the temperature values and heat source control value acquired from the ambient temperature estimating device 1 by the communication unit 31 of the information processing device 30 using the neural network 50 of the information processing device 30, and the ambient temperature estimation apparatus 1 is configured to acquire the determined weights w through the communication unit 9.

In the present embodiment, multiple (two) temperature acquisition units 7 can be provided in any positions inside the ambient temperature estimating device 1, unlike in the conventional art. This is because the optimum weights w can be set through machine learning. Thus, while the conventional art requires trial and error to determine the positions in which multiple (two) temperature acquisition units 7 are to be provided and therefore requires many man-hours, the present embodiment can significantly reduce such man-hours. Also, while the conventional art requires many man-hours to determine the correlation between the temperature values acquired by the two temperature acquisition units 7, the present embodiment can significantly reduce such man-hours by using machine learning. Thus, the present embodiment can realize high robustness and a reduction in man-hours with respect to the positions in which the temperature acquisition units 7 are provided, compared to the conventional art.

Advantageous Effects of First Embodiment

Through the above-mentioned process, the ambient temperature estimating device 1 of the first embodiment produces the following advantageous effects.

That is, the ambient temperature estimating device 1 is able to estimate the ambient temperature with much higher accuracy than conventional accuracy. Also, since the configuration of the neural network 20 and the weights w are determined on the developer side, it is possible to reduce a reduction in estimation accuracy caused by "overtraining."

2. Second Embodiment

Figure 8:
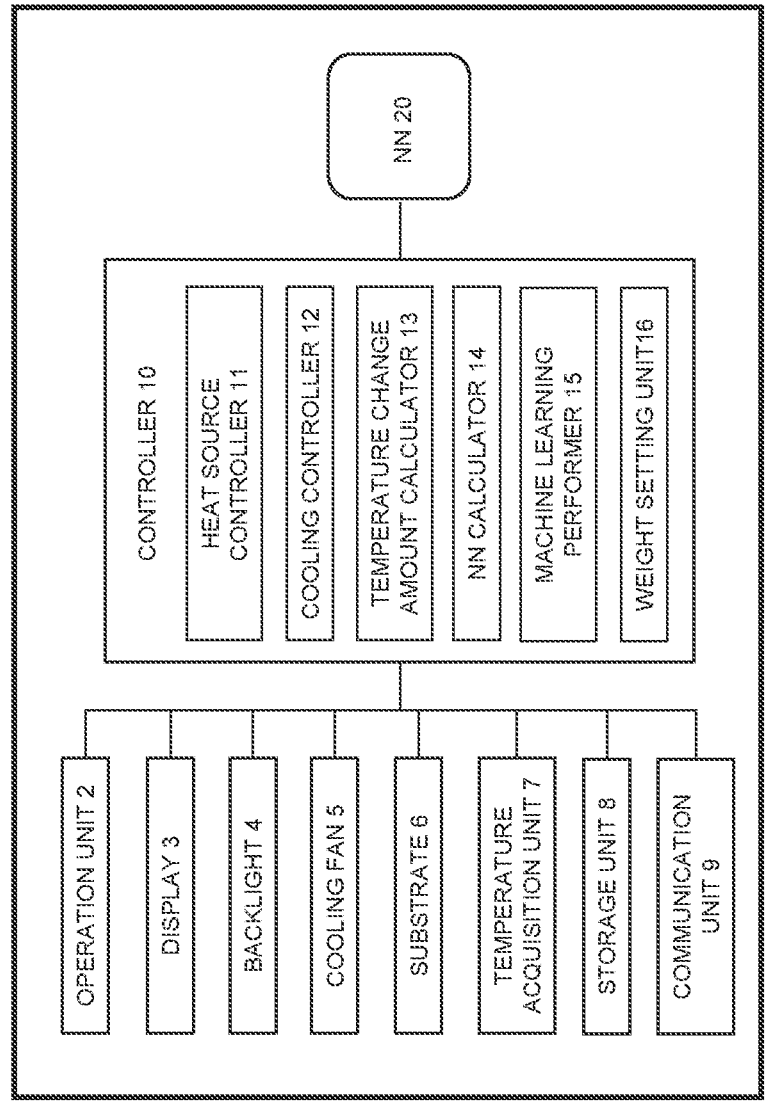
FIG. 8 is a block diagram of an ambient temperature estimating device 1 of a second embodiment of the present invention.

Referring next to FIG. 8, a second embodiment will be described. An ambient temperature estimating device 1 of the second embodiment differs from the first embodiment in that it includes a machine learning performance unit 15 and a weight setting unit 16. The difference will be described below.

Since the ambient temperature estimating device 1 of the second embodiment includes the machine learning performance unit 15 and weight setting unit 16, it is able to perform machine learning on its own and improve the ambient temperature estimation accuracy even after the ambient temperature estimating device 1 is delivered to the user.

Note that, as in the first embodiment, it is preferred to set the weights w using an information processing device 30 before shipping the ambient temperature estimating device 1. After being shipped, the ambient temperature estimating device 1 is able to improve the ambient temperature estimation accuracy on a daily basis by updating the preset weights w on its own.

3. Third Embodiment

Figure 9:
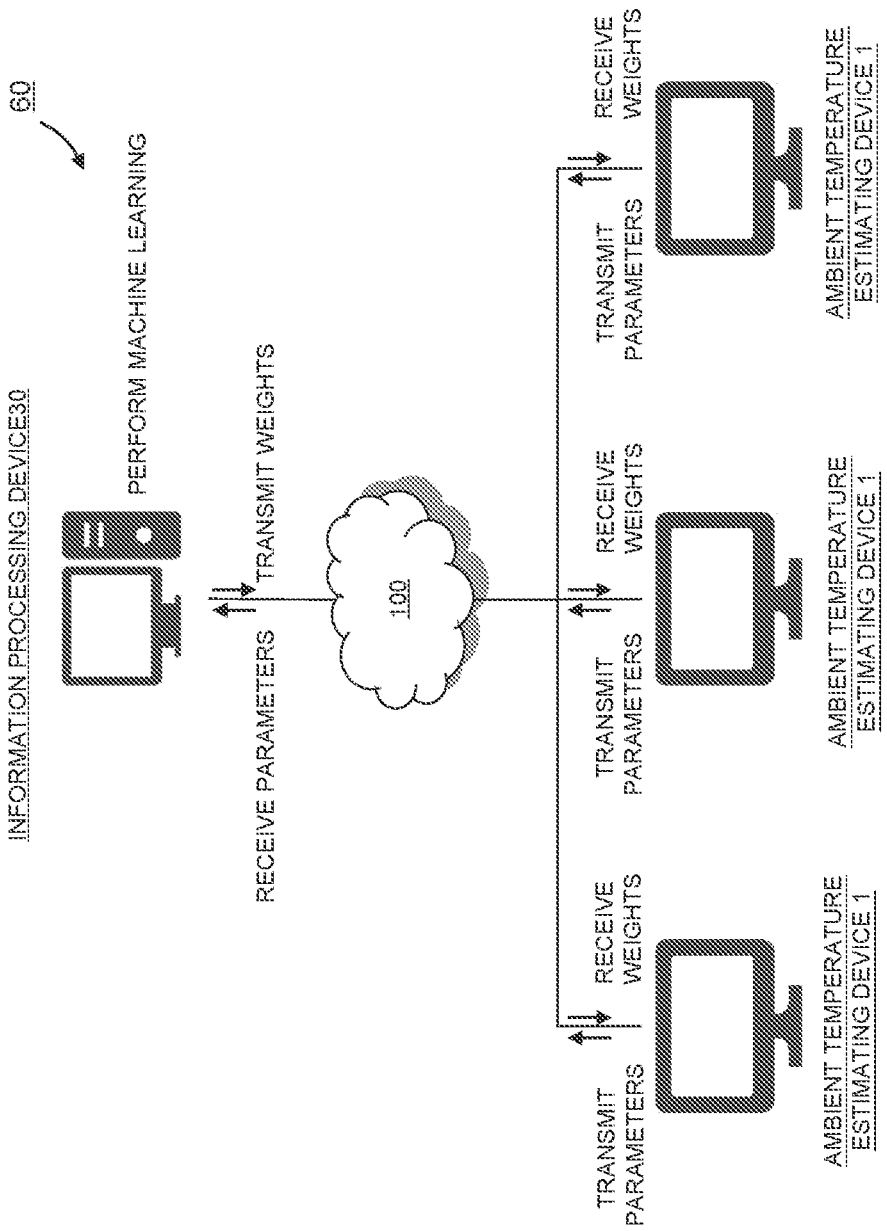
FIG. 9 is a function block diagram of a system 60 of a third embodiment of the present invention.

Referring next to FIG. 9, a system 60 of a third embodiment will be described. In the third embodiment, multiple ambient temperature estimating devices 1 are connected to an information processing device 30 through a network 100.

After being delivered to the user, each ambient temperature estimating device 1 transmits, to the information processing device 30, parameters to be inputted to the neural network 20. Then, the information processing device 30 operated by the developer performs machine learning and transmits the updated weights w to the ambient temperature estimating devices 1. The ambient temperature estimating devices 1 are able to improve the ambient temperature estimation accuracy by setting the updated weights w for the calculation nodes N of the neural network 20.

As seen above, in the third embodiment, the weights w are updated by the developer even after each ambient temperature estimating device 1 is shipped. Thus, the system 60 is able to reduce progress of inappropriate machine learning on the user side.

4. Estimation Accuracy

Hereafter, referring to FIGS. 10 to 13, there will be described the measurement result of accuracy of the ambient temperature estimated using the ambient temperature estimating device 1 of the above embodiment.

Figure 10A:
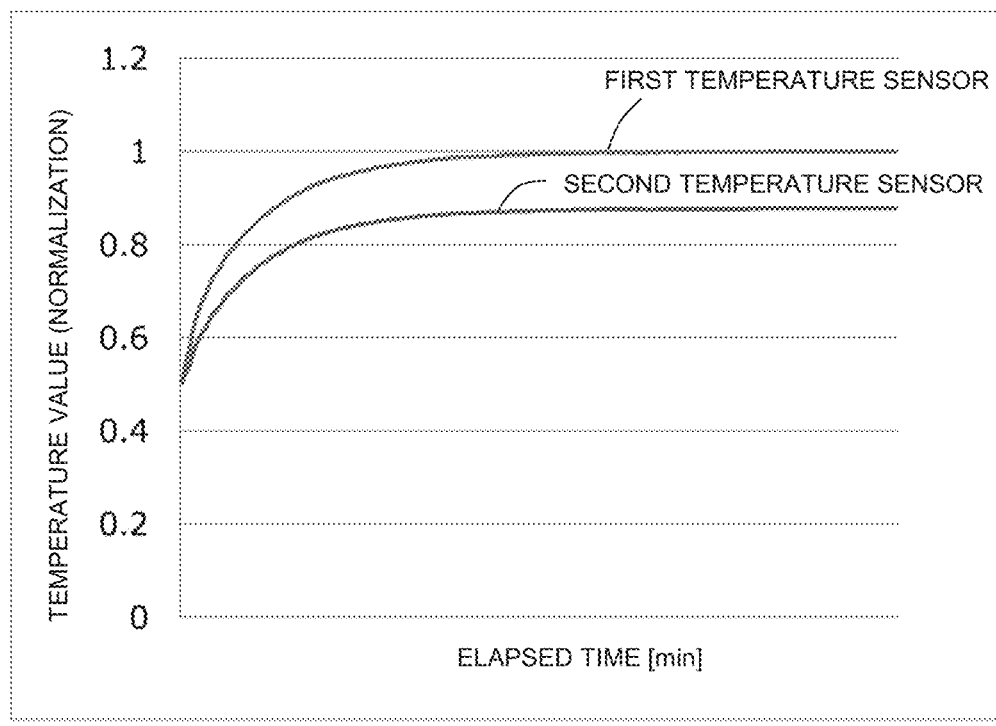
FIG. 10A is a graph showing temporal changes in temperature values detected by two temperature sensors in a case in which a cooling fan is driven in a fixed manner.
Figure 10B:
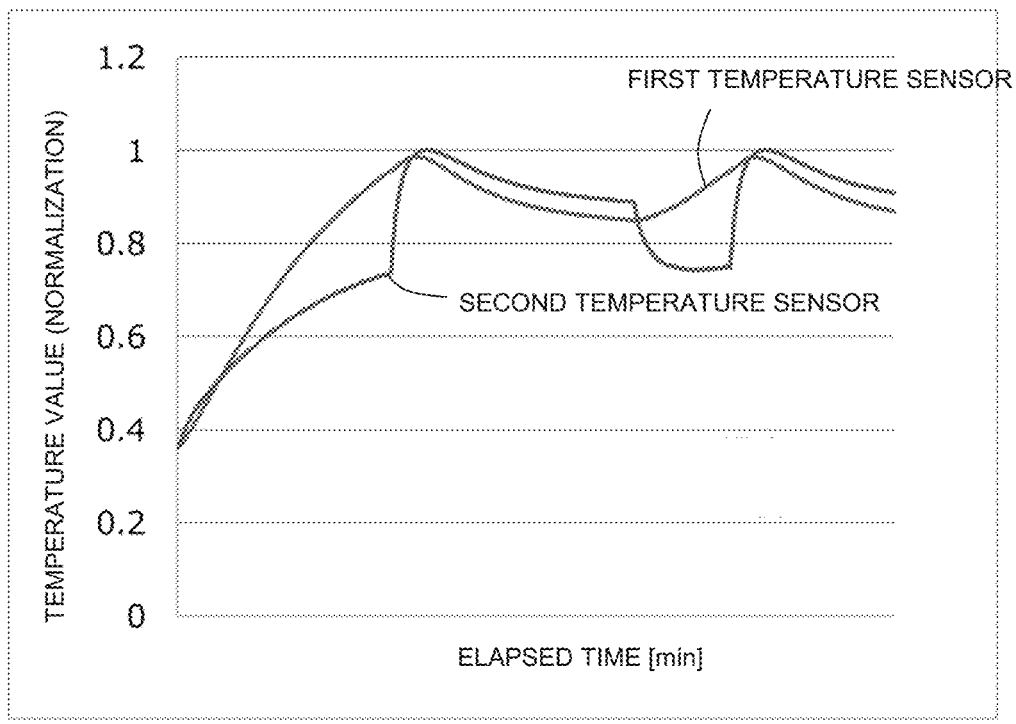
FIG. 10B is a graph showing temporal changes in temperature values detected by two temperature sensors in a case in which a cooling fan is variably controlled.

FIGS. 10A and 10B are graphs showing the significance of the ambient temperature estimating device 1 of the above embodiment. FIG. 10A is a graph showing temporal changes in the temperature values detected by the temperature acquisition unit 7 (first temperature sensor and second temperature sensor) inside the ambient temperature estimating device 1 in a case in which the cooling control value for controlling the drive strength of the cooling fan 5 is kept constant. On the other hand, FIG. 10B is a graph showing temporal changes in the temperature values detected by the temperature acquisition unit 7 (first temperature sensor and second temperature sensor) inside the ambient temperature estimating device 1 in a case in which the cooling control value for controlling the drive strength of the cooling fan 5 is dynamically changed. In FIGS. 10A and 10B, temperature values obtained by normalizing the temperatures detected by the temperature sensors are shown on the vertical axis (normalization).

As shown in FIG. 10A, where the cooling control value is constant, the ambient temperature estimation apparatus 1 of the conventional art, such as Patent Literature 1, is able to determine a relational expression for estimating the ambient temperature around the ambient temperature estimating device 1 by using the correlation between the temperatures detected by the two temperature sensors.

On the other hand, where the cooling control value is dynamically changed, the temperatures detected by the first sensor and second sensor change randomly, as shown in FIG. 10B. Accordingly, if the above embodiment is not used, it is extremely difficult to determine the correlation between the temperatures detected by the two temperature sensors.

FIG. 11 is a graph obtained by plotting the actual ambient temperature (thermocouple measurement) and the estimated ambient temperature in a case in which the ambient temperature estimating device 1 of the above embodiment is used. In FIG. 11, the vertical axis denotes the temperature, and the horizontal axis denotes the time that has elapsed after the brightness of the backlight 4 is reduced. In FIG. 11, there are plotted the temperature measured by thermocouple measurement and the temperature estimated using a conventional technique (e.g., the technology of Patent Literature 1), as well as the estimated temperatures estimated using two neural networks 20 (NN estimations). The two NN estimations in FIG. 11 consist of an estimation made without using the amount of change in temperature calculated by the temperature change amount calculator 13 (NN estimation without temperature change amount) and an estimation made using the amount of change in temperature (NN estimation with temperature change amount). Also, in FIG. 11, there are plotted together the estimation results in cases in which the actual ambient temperatures are 15° C., 25° C., and 35° C.

The cooling fan 5 was stopped when the actual ambient temperature is 15° C. and was driven with constant strength when the actual ambient temperature is 25° C. and 35° C. The reason why the cooling fan 5 was stopped when the ambient temperature is 15° C. is that there is less need to cool the inside of the ambient temperature estimating device 1 using the cooling fan 5. This case is intended to reproduce an actual use scene.

As shown in FIG. 11, when the ambient temperature is 25° C. or 35° C., that is, when the cooling fan 5 is being driven with constant strength, even the conventional technique was confirmed to show high estimation accuracy.

On the other hand, when the ambient temperature is 15° C., that is, when the cooling fan 5 is being stopped, the error between the ambient temperature estimated using the conventional technique and the actual ambient temperature was increased. This error was up to 4° C., and the ambient temperature estimation accuracy was low. One reason seems that the temperature inside the ambient temperature estimating device 1 randomly changed due to the stop of the cooling fan 5 (corresponds to the state in FIG. 10B). Another reason seems that the internal temperature rose compared to when the fan is being driven with constant strength.

On the other hand, the two NN estimations made using the above embodiment showed extremely high accuracy even when the ambient temperature was 15° C., that is, even when the cooling fan 5 is being stopped. In the case of the NN estimation without temperature change amount, the temperature inside the ambient temperature estimating device 1 was not sufficiently reduced due to the stop of the cooling fan 5 immediately after the brightness of the backlight of the ambient temperature estimating device 1 was reduced and therefore its accuracy was lower than that when the ambient temperature is 25° C. and 35° C. On the other hand, in the case of the NN estimation with temperature change amount, its accuracy is understood to have improved compared to that of the NN estimation without temperature change amount immediately after the brightness of the backlight 4 was reduced. Namely, by performing machine learning using the amount of change in temperature, the configuration of the embodiment can determine whether the temperature inside the ambient temperature estimating device 1 corresponds to a temperature immediately after the brightness of the backlight 4 of the ambient temperature estimating device 1 is reduced or whether the temperature inside the ambient temperature estimating device 1 has become the steady state. Note that the estimation accuracy improves for a similar reason also immediately after the ambient temperature estimating device 1 is powered on.

As seen above, the use of the above embodiment allows for achievement of higher estimation accuracy than conventional accuracy. In particular, the use of the amount of change in temperature further improves the estimation accuracy.

Figure 12:
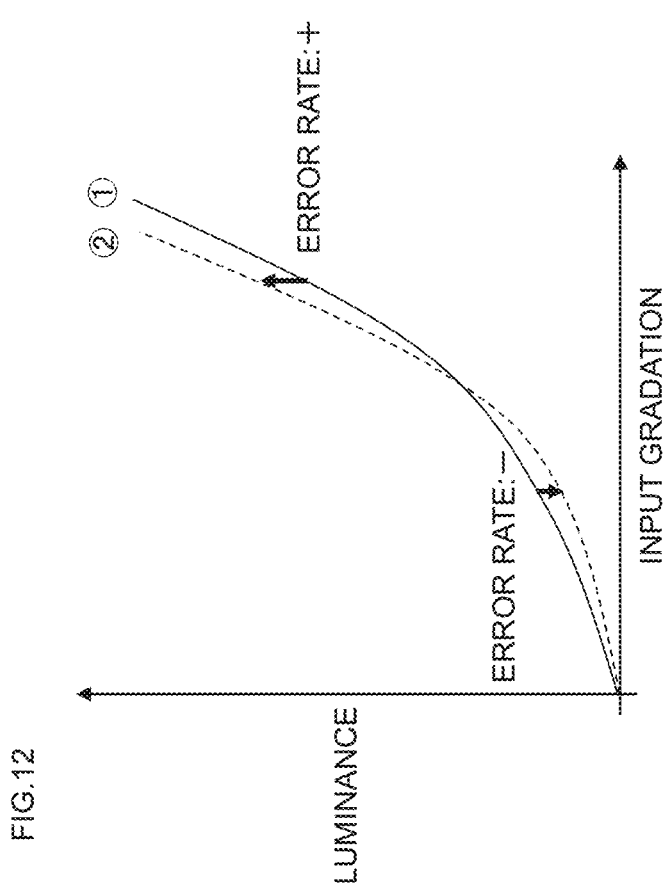
FIG. 12 is a schematic diagram showing the relationship between the input gradation inputted to the ambient temperature estimating device 1 and the luminance of the display 3.

FIGS. 12 and 13 are graphs showing the relationship between the input gradation and the luminance of the display 3 in the conventional art and the above embodiment.

FIG. 12 is a schematic diagram showing the relationship between a gamma curb (solid line 1) set for the ambient temperature estimating device 1 and the actually measured luminance (dotted line 2) of the display 3 wherein the horizontal axis denotes the input gradation and the vertical axis denotes the luminance. The measured luminance of the display 3 follows the solid line 1 under an ideal condition that the ambient temperature estimation accuracy of the ambient temperature estimating device 1 is 100% and the accuracy of the gamma correction corresponding to the ambient temperature is perfect. On the other hand, if the ambient temperature estimation accuracy is low, the measured luminance of the ambient temperature estimating device 1 is displaced upward or downward from the ideal dotted line 1, as shown by the dotted line 2. As shown in FIG. 12, upward displacement from the solid line 1 is defined as "+ error rate", and downward displacement from the solid line 1 is defined as "− error rate".

FIG. 13 is a graph showing the error rate of the luminance of the display 3 in cases in which the cooling control value of the cooling fan 5 is changed dynamically under multiple ambient temperatures. In FIG. 13, the vertical axis denotes the error rate, and the horizontal axis denotes the RGB gradation value. Note that it is assumed that R, G, and B have the same gradation value in FIG. 13. It is also assumed that multiple ambient temperatures in FIG. 13 are the same as those in FIG. 11. Specifically, FIG. 13 shows the error rates under the following 12 conditions.

1: temperature 15° C., backlight set value 769
2: temperature 15° C., backlight set value 512
3: temperature 15° C., backlight set value 256
4: temperature 15° C., backlight set value 30
5: temperature 25° C., backlight set value 769
6: temperature 25° C., backlight set value 512
7: temperature 25° C., backlight set value 256
8: temperature 25° C., backlight set value 30
9: temperature 30° C., backlight set value 769
10: temperature 30° C., backlight set value 512
11: temperature 30° C., backlight set value 256
12: temperature 30° C., backlight set value 30

Figure 13A:
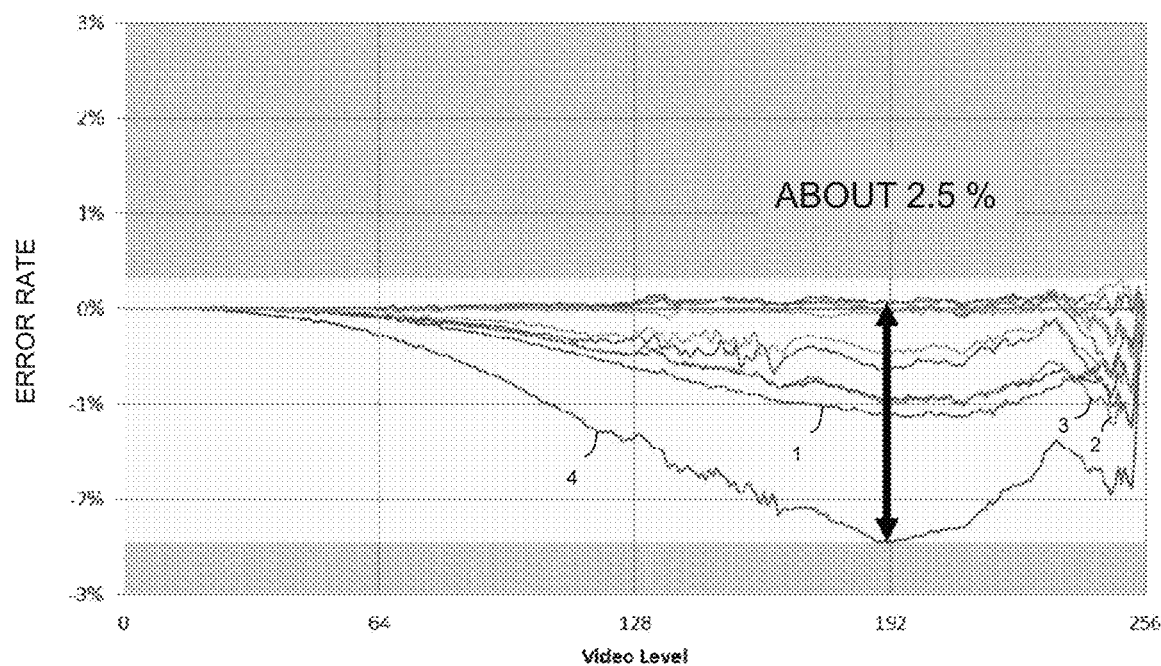
FIG. 13A shows display characteristics of the ambient temperature estimating device 1 of one of the embodiments of the present invention.
Figure 13B:
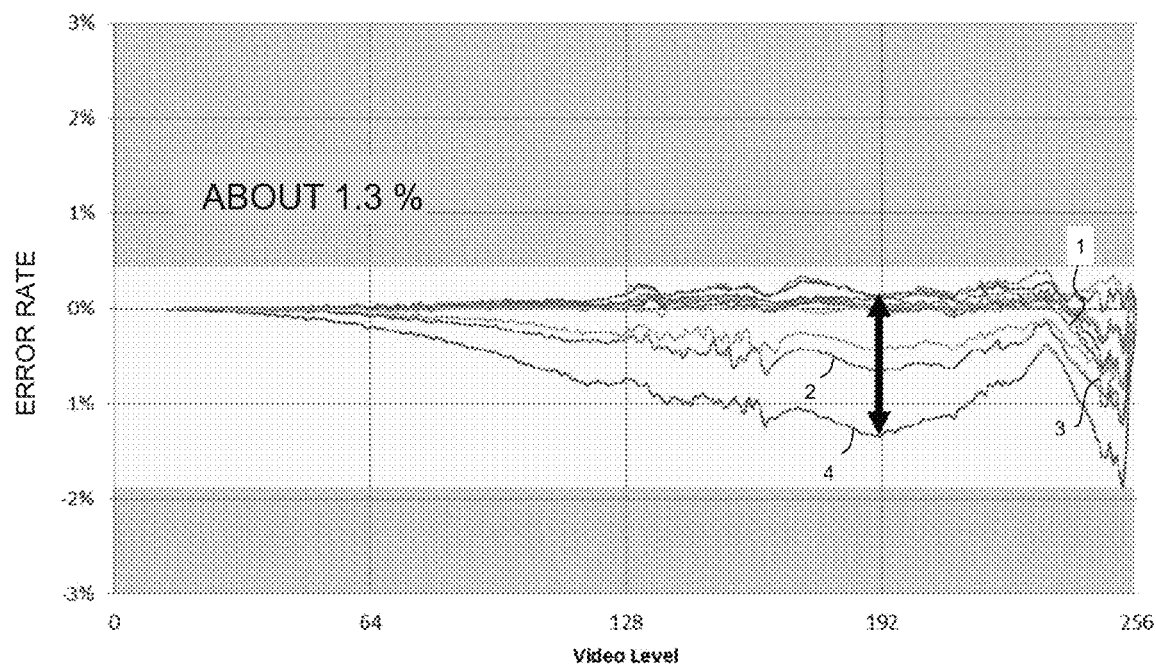
FIG. 13B shows display characteristics of a display device that does not estimate the ambient temperature.

FIG. 13A shows the error rate of the luminance of the display 3 when the conventional art is used. FIG. 13B shows the error rate of the luminance of the display 3 when the above embodiment is used.

In the case of the conventional art, when the cooling control value of the cooling fan 5 is changed dynamically, the ambient temperature estimation accuracy was low and thus the gamma correction accuracy was also low, as shown in FIG. 13A. As a result, the absolute value of the error rate of the luminance of the display 3 was up to approximately 2.5% (condition 4).

On the other hand, in the case of the above embodiment, even when the cooling control value of the cooling fan 5 is changed dynamically, the ambient temperature estimation accuracy was high and thus the gamma correction accuracy was also high, as shown in FIG. 13B. As a result, the absolute value of the error rate of the luminance of the display 3 was reduced to up to approximately 1.3% (condition 4).

Others

While the various embodiments have been described, the present invention can also be carried out in the following aspects.

An ambient temperature estimating method includes: a
    temperature acquisition step of acquiring, by a temperature acquisition unit, one or more temperature values inside an ambient temperature estimating device; and a neural network calculation step of estimating, by a neural network calculator, an ambient temperature around the ambient temperature estimating device using a neural network.

Input values inputted to the neural network include the temperature values acquired by the temperature acquisition unit and a heat source control value for controlling a heat source inside the ambient temperature estimating device.

A program for causing a computer to function as:

a neural network;

a temperature acquisition unit configured to acquire one or more temperature values inside an ambient temperature estimating device; and a neural network calculator configured to estimate an ambient temperature around the ambient temperature estimating device using the neural network.

Input values inputted to the neural network by the neural network calculator include the temperature values acquired by the temperature acquisition unit and a heat source control value for controlling a heat source inside the ambient temperature estimating device.

The present invention can also be applied to cases in which the cooling control value of the cooling fan 5 is changed in various manners including a linear manner Only one of the temperature acquisition units 7 may be used.

The number of calculation nodes N and the number of layers may be any numbers.

If the present invention is applied to an organic EL display without the backlight 4, it is possible to regard the internal circuits or substrate as a heat source and use a control value corresponding to the internal circuits or substrate as a heat source control value.

The embodiments in which the external ambient temperature is estimated using only information about the inside of the display device have been described as examples of the ambient temperature estimating device 1. The reason is that if the temperature sensors are disposed outside the display device, the temperature sensors are influenced by heating of the display device, which makes it difficult to accurately measure the ambient temperature. The present invention can also be applied to various devices having a similar problem (devices that estimate the external ambient temperature using only information about the inside of the devices).

REFERENCE SIGNS LIST

1: ambient temperature estimation apparatus
2: operation unit
3: display
4: backlight
5: cooling fan
6: substrate
7: temperature acquisition unit
8: storage unit
9: communication unit
10: controller
11: heat source controller
12: cooling controller
13: temperature change amount calculator
14: neural network calculator
20: neural network
30: information processing device
31: communication unit
32: parameter acquisition unit
33: storage unit
40: controller
41: temperature change amount calculator
42: neural network calculator
43: machine learning performer
44: weight setting unit
50: neural network
60: system

The invention claimed is:

1. An ambient temperature estimating device comprising:
a neural network;
a temperature acquisition unit configured to acquire one or more temperature values inside the ambient temperature estimating device;
a neural network calculator configured to estimate an ambient temperature around the ambient temperature estimating device using the neural network; and
a cooling controller configured to control an inside of the ambient temperature estimating device based on a cooling control value,
wherein the cooling controller is configured to dynamically control the cooling control value,
input values inputted to the neural network by the neural network calculator include the temperature values acquired by the temperature acquisition unit, a heat source control value for controlling a heat source inside the ambient temperature estimating device, and the cooling control value, and
the cooling control value includes a set value between a minimum set value and a maximum set value.

2. The ambient temperature estimating device of claim 1, wherein the input values include the amount of change in the temperature values in a predetermined period.

3. The ambient temperature estimating device of claim 1, wherein the heat source is a backlight or an internal circuit.

4. The ambient temperature estimating device of claim 1, wherein the input values include an energizing time of at least one of the ambient temperature estimating device and the heat source.

5. The ambient temperature estimating device of claim 1, wherein
the neural network includes a plurality of calculation nodes,
predetermined weights are set for the respective calculation nodes, and
the weights are set through machine learning previously performed by another information processing device or through machine learning performed by the ambient temperature estimating device.

6. An ambient temperature estimating method comprising:
a temperature acquisition step of acquiring, by a temperature acquisition unit, one or more temperature values inside an ambient temperature estimating device;
a neural network calculation step of estimating, by a neural network calculator, an ambient temperature around the ambient temperature estimating device using a neural network; and
a cooling controlling step of controlling, by a cooling controller, an inside of the ambient temperature estimating device based on a cooling control value, wherein
in cooling controlling step, the cooling control value is dynamically controlled, input values inputted to the neural network include
the temperature values acquired by the temperature acquisition unit,
a heat source control value for controlling a heat source inside the ambient temperature estimating device, and the cooling control value,
the cooling control value includes a set value between a minimum set value and a maximum set value.

7. A non-transitory computer readable medium that stores a program for causing a computer to function as:
a neural network;
a temperature acquisition unit configured to acquire one or more temperature values inside an ambient temperature estimating device;
a neural network calculator configured to estimate an ambient temperature around the ambient temperature estimating device using the neural network
a cooling controller configured to control an inside of the ambient temperature estimating device based on a cooling control value, wherein
the cooling controller is configured to dynamically control the cooling control value,
input values inputted to the neural network by the neural network calculator include
the temperature values acquired by the temperature acquisition unit,
a heat source control value for controlling a heat source inside the ambient temperature estimating device, and the cooling control value,
the cooling control value includes a set value between a minimum set value and a maximum set value.

8. A system comprising:
the ambient temperature estimating device of claim 1; and
an information processing device, wherein
the ambient temperature estimating device and the information processing device include communication units configured to be able to communicate data to each other and neural networks,
the neural networks each include a plurality of calculation nodes,
predetermined weights are set for the respective calculation nodes,
the information processing device is configured to acquire, through the communication unit, temperature values acquired by the temperature acquisition unit of the ambient temperature estimating device, a heat source control value for controlling a heat source inside the ambient temperature estimating device, and a cooling control value for cooling control an inside of the ambient temperature estimating device,
the calculation nodes and the weights are determined by machine leaning of the temperature values, the heat source control value, and the cooling control value using the neural network of the information processing device, the temperature values from the ambient temperature estimating device, the heat source control value, and the cooling control value being acquired by the communication unit of the information processing device, and
the ambient temperature estimating device is configured to acquire the determined weights through the communication unit.

* * * * *